(12) United States Patent  
Breitlow et al.

(10) Patent No.: US 12,540,955 B2  
(45) Date of Patent: Feb. 3, 2026

(54) POWER CONVERTER FOR A THERMAL SYSTEM

(71) Applicant: WATLOW ELECTRIC MANUFACTURING COMPANY, St. Louis, MO (US)

(72) Inventors: Stanton H. Breitlow, Winona, MN (US); John Lemke, St. Louis, MO (US); James Hentges, Winona, MN (US); Keith Ness, St. Louis, MO (US); Eric Ellis, Columbia, MO (US); William Bohlinger, Winona, MN (US); Matthew Yender, St. Louis, MO (US); Dean R. Mccluskey, St. Louis, MO (US)

(73) Assignee: WATLOW ELECTRIC MANUFACTURING COMPANY, St. Louis, MO (US)

( * ) Notice: Subject to any disclaimer, the term of this patent is extended or adjusted under 35 U.S.C. 154(b) by 914 days.

(21) Appl. No.: 16/868,223

(22) Filed: May 6, 2020

(65) Prior Publication Data

US 2020/0264216 A1  Aug. 20, 2020

Related U.S. Application Data

(63) Continuation-in-part of application No. 15/624,060, filed on Jun. 15, 2017, now Pat. No. 10,690,705.

(Continued)

(51) Int. Cl.
G01R 19/165  (2006.01)
F24D 11/02  (2006.01)

(Continued)

(52) U.S. Cl.
CPC ........ *G01R 19/225* (2013.01); *F24D 11/0207* (2013.01); *G01R 19/16519* (2013.01);

(Continued)

(58) Field of Classification Search
CPC ............ G01R 19/225; G01R 19/16519; G01R 19/257; F24D 11/0207; H01L 21/67115; H05B 1/0233; Y02B 30/17
See application file for complete search history.

(56) References Cited

U.S. PATENT DOCUMENTS 5,150,032 A * 9/1992 Ho .................... H02J 7/0068  
    307/66  
6,765,808 B1 * 7/2004 Jin .................... H02M 3/156  
    363/16

(Continued)

FOREIGN PATENT DOCUMENTS

CN     105391321 A    3/2016  
CN     106031016 A    10/2016

(Continued)

OTHER PUBLICATIONS

Capacitor-Definition, 2009, www.merriam-webster.com, p. 1 (Year: 2009).*

(Continued)

*Primary Examiner* — Tiffany T Tran  
(74) *Attorney, Agent, or Firm* — Burris Law, PLLC

(57) ABSTRACT

The present disclosure generally describes a method and system for converting power to operate a load being supplied by line power having a line energy. The method includes rectifying the line power, bucking the rectified line power to generate a desired voltage output such that current is drawn from the line power in phase with the desired voltage output, and bypassing switching energy created during the bucking of the rectified line power.

24 Claims, 7 Drawing Sheets

Related U.S. Application Data

(60) Provisional application No. 62/350,275, filed on Jun. 15, 2016.

(51) Int. Cl.
*G01R 19/22* (2006.01)
*G01R 19/257* (2006.01)
*H01L 21/67* (2006.01)
*H05B 1/02* (2006.01)

(52) U.S. Cl.
CPC ...... *G01R 19/257* (2013.01); *H01L 21/67115* (2013.01); *H05B 1/0233* (2013.01); *Y02B 30/17* (2018.05)

(56) References Cited

U.S. PATENT DOCUMENTS

| | | | |
|---|---|---|---|
| 6,998,824 | B2 | 2/2006 | Nishimaki |
| 7,115,988 | B1* | 10/2006 | Hool ................ H01L 23/36 257/E23.079 |
| 7,145,111 | B2 | 12/2006 | Hori |
| 7,813,148 | B2 | 10/2010 | Zeng et al. |
| 8,548,312 | B2* | 10/2013 | Goldin ............ H01L 21/67115 392/407 |
| 9,563,220 | B1* | 2/2017 | Singh ................ G05F 3/02 |
| 2004/0039487 | A1 | 2/2004 | Fennewald et al. |
| 2005/0109767 | A1 | 5/2005 | Fennewald et al. |
| 2011/0174801 | A1 | 7/2011 | Schwerman |
| 2012/0205982 | A1 | 8/2012 | Navarro et al. |
| 2013/0287377 | A1* | 10/2013 | Serebryanov ..... H01L 21/67115 392/416 |
| 2016/0125940 | A1* | 5/2016 | Kang ................ G11C 13/004 365/148 |
| 2016/0181911 | A1* | 6/2016 | Knauss ............ H05B 47/19 315/307 |
| 2018/0048237 | A1 | 2/2018 | Tschirhart et al. |
| 2020/0099257 | A1* | 3/2020 | Qiu ................ H02J 7/00712 |

FOREIGN PATENT DOCUMENTS

| | | |
|---|---|---|
| CN | 107852087 A | 3/2018 |
| CN | 109155606 A | 1/2019 |
| JP | 2002215246 | 7/2002 |
| JP | 2003228250 | 8/2003 |
| JP | 2004303466 | 10/2004 |
| JP | 4196697 B2 | 12/2008 |
| JP | 2009033905 | 2/2009 |
| KR | 1020010071917 A | 7/2001 |
| KR | 1020150004389 | 1/2015 |
| TW | 201345133 A | 11/2013 |
| WO | 2001052602 | 7/2001 |
| WO | 2015016885 | 2/2015 |

OTHER PUBLICATIONS

Absorb-Definition, 2005, www.merriam-webster.com, p. 1 (Year: 2005).*
Office Action issued in corresponding CN Application No. 201780049895.X dated Sep. 30, 2022 and English Translation, 23 pages.
Office Action for JP Application No. 2018565756, mailed Dec. 1, 2020.
European Search Report for Corresponding EP Application 20211264, completed Mar. 16, 2021.
Office Action issued to corresponding KR Appl. No. 1020217018748, issued Jul. 28, 2021, and English Translation thereof.
Search Report issued in Taiwanese counterpart application No. 111137680 by the TIPO on Apr. 14, 2023, 2 pages.
Office Action issued in corresponding KR Application No. 1020237023444 dated Mar. 6, 2024 and English Translation, 15 pages.

* cited by examiner

5% Conduction

25% Conduction

50% Conduction

5% Conduction

25% Conduction

50% Conduction

POWER CONVERTER FOR A THERMAL SYSTEM

CROSS-REFERENCE TO RELATED APPLICATIONS

This application is a continuation-in-part application of U.S. patent application Ser. No. 15/624,060, filed Jun. 15, 2017, which claims the benefit of and priority to U.S. Provisional Application No. 62/350,275 filed on Jun. 15, 2016. The disclosure of the above application is incorporated herein by reference.

FIELD

The present disclosure relates to a power device for providing varied power to a thermal system.

BACKGROUND

The statements in this section merely provide background information related to the present disclosure and may not constitute prior art.

An electric heater operable to heat a load at a range of temperatures is typically powered by a power control device that provides adjustable power to the heater. Some power control devices use phase angle control (i.e., phase-fired control) to limit power from a power supply by modulating a power switch, such as a thyristor or triac, at a predetermined phase. In another example, the power control device can be a variable direct current (DC) power source that converts alternating current (AC) power into DC power. While specific examples are provided, other power control devices may also be used.

The above described power control devices can have poor harmonics and reduced power factor that can require additional components for compensating for the power factor. These issues associated with power control devices, among other issues related to providing adjustable power to an electric heater, are addressed by the present disclosure.

SUMMARY

This section provides a general summary of the disclosure and is not a comprehensive disclosure of its full scope or all of its features.

In one form, the present disclosure is directed to a method of converting power to operate a load being supplied by line power having a line energy. The method includes rectifying the line power, bucking the rectified line power to generate a desired voltage output, where the bucking creates a switching energy, and bypassing the switching energy. Current is drawn from the line power in phase with the desired voltage output.

In another form, the line power is direct current (DC) power.

In yet another form, the line power is alternating current (AC) power.

In one form, the line power is a single-phase AC power.

In another form, the line energy is not stored prior to bucking the rectified line power.

In yet another form, the desired voltage output is less than or equal to an input voltage of the line power.

In one form, the method further includes determining the desired voltage output prior to bucking the rectified line power.

In another form, the method further includes applying the desired voltage output to a heater.

In one form, the present disclosure is directed to a system that includes a rectifier configured to receive a line power having a line energy and rectify the line power, a buck converter configured to generate a desired voltage output based on the rectified line power, and a bypass capacitor. The buck converter creates a switching energy concurrently with the desired voltage output. The bypass capacitor is disposed between the rectifier and the buck converter and is configured to bypass the switching energy to dissipate the switching energy at an input of the buck converter. Current is drawn from the line power in phase with the desired voltage output.

In another form, the system further includes a controller electrically coupled to the buck converter to operate the buck converter and configured to determine the desired voltage output to be generated by the buck converter.

In yet another form, the buck converter includes a power switch, and the controller is configured to operate the power switch to generate the desired voltage output.

In one form, the rectifier is configured to receive direct current (DC) power as the line power.

In another form, the rectifier is configured to receive alternating current (AC) power as the line power.

In yet another form, the rectifier is configured to receive a single-phase AC power as the line power.

In one form, the desired voltage output is less than or equal to an input voltage of the line power.

In another form, the bypass capacitor is electrically coupled in parallel with the buck converter.

In yet another form, the system further includes an output capacitor disposed at an output of the buck converter to absorb the switch energy.

In one form, the present disclosure is directed to a thermal system that includes a power converter system, as described herein, and a heater electrically coupled to the power converter system to receive the desired voltage output.

Further areas of applicability will become apparent from the description provided herein. It should be understood that the description and specific examples are intended for purposes of illustration only and are not intended to limit the scope of the present disclosure.

DRAWINGS

In order that the disclosure may be well understood, there will now be described various forms thereof, given by way of example, reference being made to the accompanying drawings, in which.

Figure 5A:
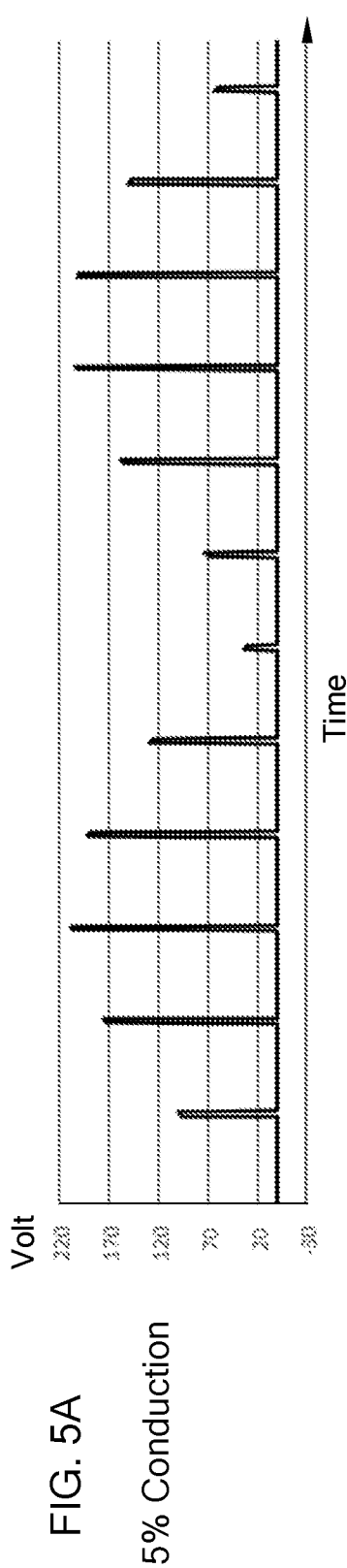
Figure 5B:
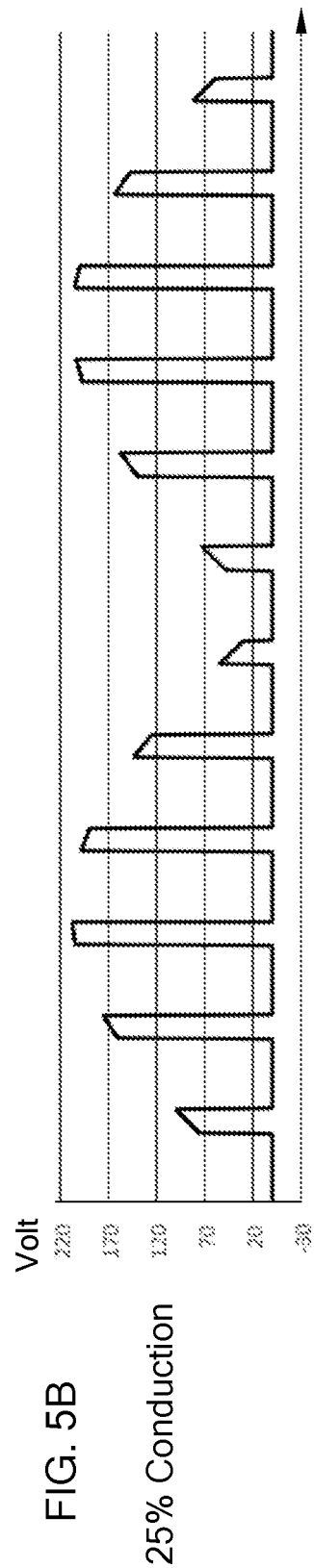
Figure 5C:
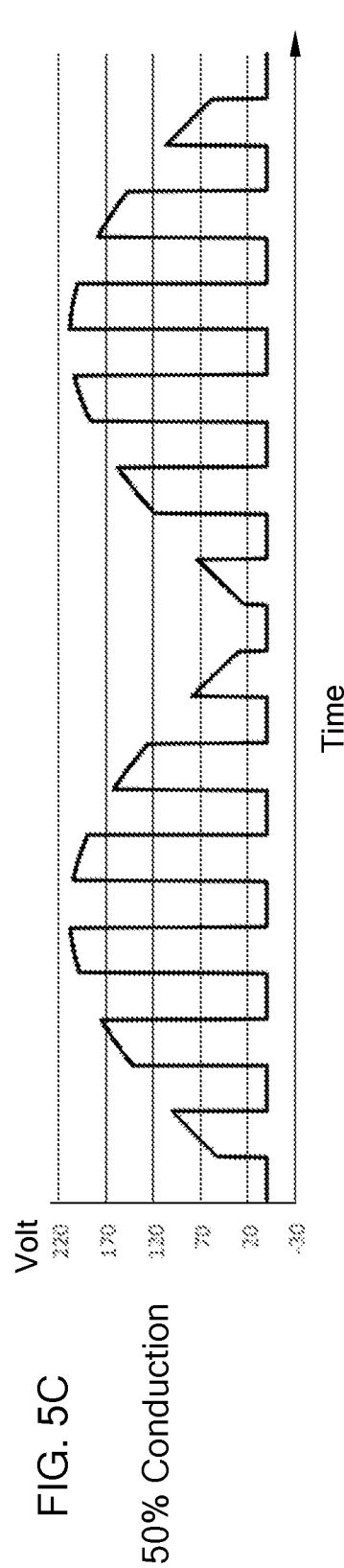
Figure 6A:
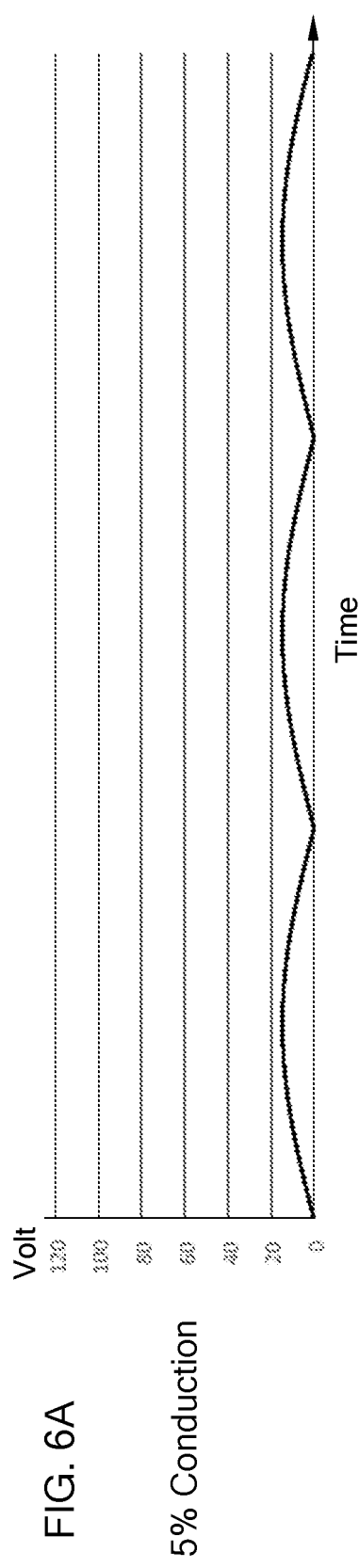
Figure 6B:
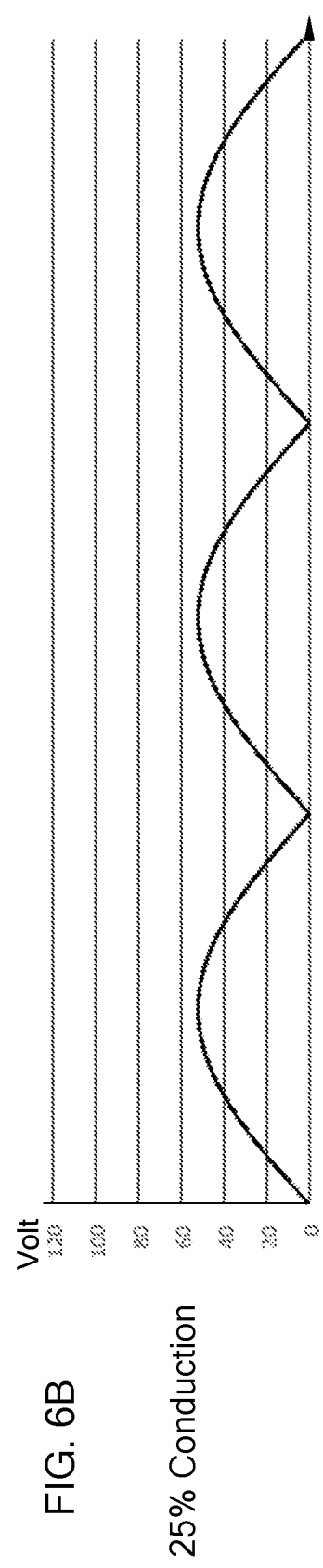
Figure 6C:
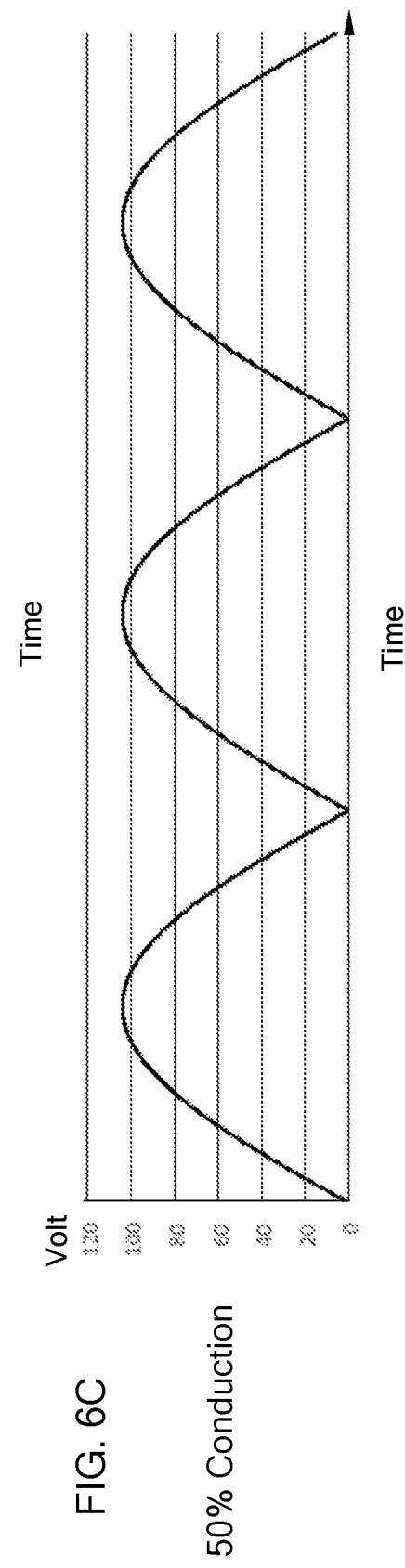
Figure 7A:
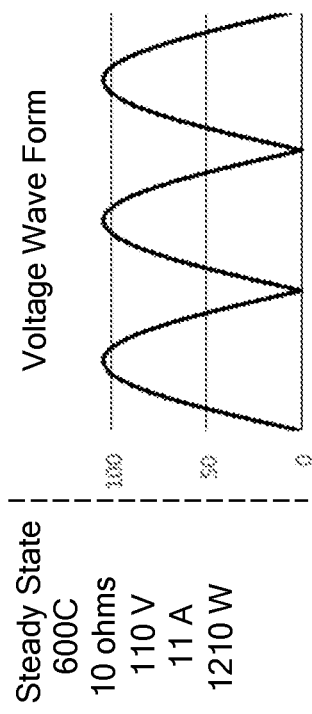
Figure 7B:
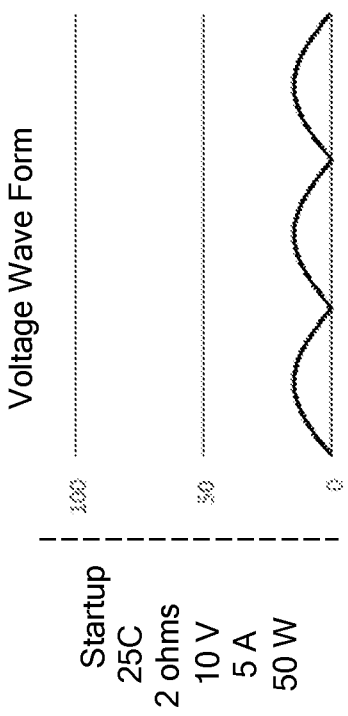
Figure 7C:
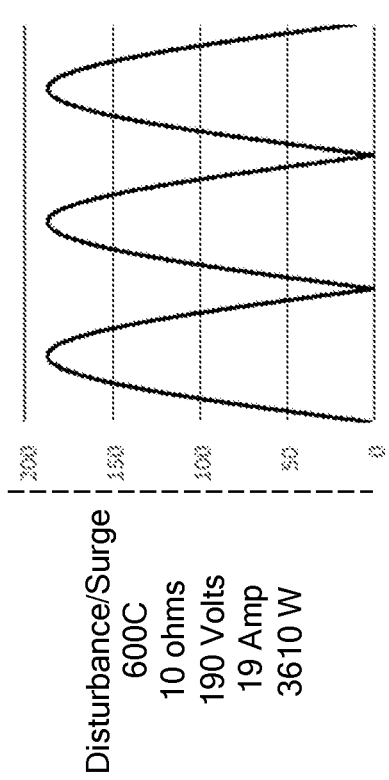
Figure 7D:
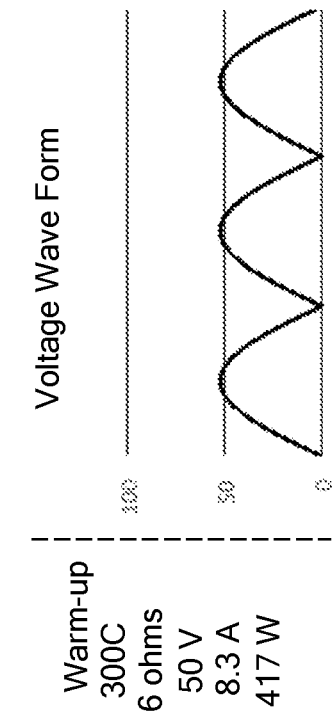

FIGS. 5A, 5B, and 5C illustrate waveforms of drive signals having different conduction rates in accordance with the teachings of the present disclosure;

FIGS. 6A, 6B, and 6C illustrate waveforms of voltage outputs of the power converter based on the waveforms of FIGS. 5A, 5B, and 5C, respectively, in accordance with the teachings of the present disclosure; and FIGS. 7A, 7B, 7C, and 7D illustrate waveforms of different voltage outputs of the power converter based on different input conditions in accordance with the teachings of the present disclosure.

The drawings described herein are for illustration purposes only and are not intended to limit the scope of the present disclosure in any way.

DETAILED DESCRIPTION

The following description is merely exemplary in nature and is not intended to limit the present disclosure, application, or uses. It should be understood that throughout the drawings, corresponding reference numerals indicate like or corresponding parts and features.

Figure 1:
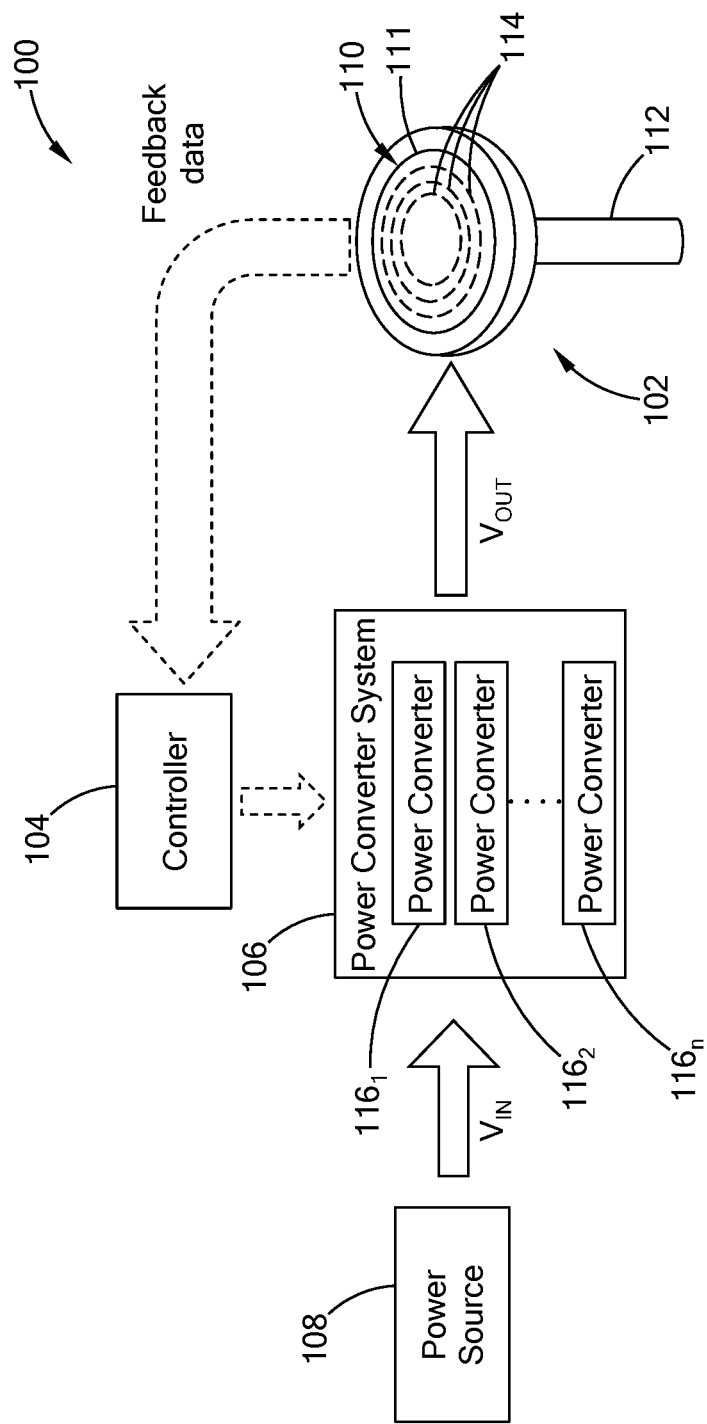
FIG. 1 is a block diagram of an electrical thermal system in accordance with the teachings of the present disclosure.

Referring to FIG. 1, an electrical thermal system 100 constructed in accordance with the teachings of the present disclosure includes a heater 102, a controller 104 (i.e., a control module), and a power converter system 106. The controller 104 and the power converter system 106 control the power supplied to the heater 102 from a power source 108. More particularly, the controller 104 and the power converter system 106 operate as a control system for monitoring and if needed, adjusting the power supplied to the heater 102. As described in detail below, the controller 104 receives feedback data from the heater 102 to determine if power to any of the heater zones of the heater 102 is to be adjusted, and if so, adjusts the power by transmitting signals to the power converter system 106 to have one or more power converters output a controlled voltage to respective heater zones of the heater 102.

In one form of the present disclosure, the heater 102 is a pedestal heater including a heating plate 110 and a support shaft 112 disposed at a bottom surface of the heating plate 110. The heating plate 110 includes a substrate 111 and a plurality of resistive heating elements (not shown) embedded in the substrate 111 in one form of the present disclosure. The resistive heating elements may also be disposed on at least one surface of the substrate 111 while remaining within the scope of the present disclosure. The substrate 111 may be made of ceramics or aluminum. The resistive heating elements are independently controlled by the controller 104 and define a plurality of heating zones 114 as illustrated by the dotted lines in the figure. It should be understood that these heating zones 114 are merely exemplary and could take on any configuration while remaining within the scope of the present disclosure.

The resistive heating elements can be configured in various suitable ways. For example, in one form of the present disclosure, each of the resistive heating elements is connected to a first power pin and a second power pin to define a first junction and a second junction, respectively. The first and second power pins are connected to wires which extend from the heating plate 110 through the support shaft 112 of the heater 102 to the controller 104. The first and second power pins function as thermocouples and are provided as temperature sensing power pins for measuring temperature of the heater 102. Using the power pins as a thermocouple to measure a temperature of a resistive heating element has been disclosed in co-pending application, U.S. Ser. No. 14/725,537, filed May 29, 2015 and titled "RESISTIVE HEATER WITH TEMPERATURE SENSING POWER PINS," which is commonly owned with the present application and the contents of which are incorporated herein by reference in its entirety. Generally, the controller 104, which is in communication with the first and second power pins, is configured to measure changes in voltage at the first and second junctions. More specifically, the controller 104 measures millivolt (mV) changes at the junctions and then uses these changes in voltage to calculate an average temperature of the resistive heating element. In one form, the controller 104 may measure changes in voltage at the junctions without interrupting power to the resistive heating element. This may be accomplished, for example, by taking a reading at the zero crossing of an AC input power signal. In another form, power is interrupted and the controller 104 switches from a heating mode to a measuring mode to measure the changes in voltage. Once the average temperature is determined, the controller 104 switches back to the heating mode.

The heater 102 may be configured in various suitable ways, and is not limited to the two pin resistive heating elements. For example, the heater 102 may be a "two-wire" heater such that changes in resistance can be used by the controller 104 to determine temperature. Such a two-wire system is disclosed in U.S. Pat. No. 7,196,295, which is commonly owned with the present application and the contents of which are incorporated herein by reference in their entirety. In a two-wire system, the thermal system is an adaptive thermal system that merges heater designs with controls that incorporate power, resistance, voltage, and current in a customizable feedback control system that limits one or more these parameters (i.e., power, resistance, voltage, current) while controlling another. The controller 104 is configured to monitor at least one of current, voltage, and power delivered to the heater over a period time to acquire stable continuous current and voltage readings. These readings can then be used for determining resistance, and thus, temperature of the heater. Alternately, the controller 104 may be coupled to discrete temperature and/or resistance sensor(s) (e.g., a separate thermocouple).

The power converter system 106 include a plurality of power converters 116 ($116_1$ to $116_n$ in figures). One or more power converters 116 are connected to heating elements of a heating zone of the heater 102 to supply voltage to the heating elements. As described further below, each power converter 116 is operable to adjust an input voltage ($V_{IN}$) from the power source 108 to an voltage output ($V_{OUT}$) that is applied to the heating elements of the heater 102, where the voltage output is less than or equal to the input voltage.

The controller 104 includes electronics including microprocessor and memory, and is configured to control the power supplied to the resistive heating elements of the heater 102 by the power converter system 106. As described further below, the controller 104 operates the power converter system 106 to adjust the voltage applied to the heater 102 based on feedback data from the heater 102 and pre-stored control algorithms and/or processes. In one form of the present disclosure, an input voltage from the power source 108 is scaled using a scaling factor, such as that disclosed in U.S. Pat. Nos. 7,257,464 and 8,423,193, which are commonly assigned with the present application and the contents of which are incorporated herein by reference in their entirety. The input voltage can be scaled based on a preset user value. The preset user value is one of maximum voltage output level and maximum power output level, or generally may be current, voltage, or wattage. The current is measured simultaneously with scaling the voltage and providing power to the heater. The scaling comprises a gradual ramp-up, or a ramping function, to detect heater characteristics during the ramp-up. The heater characteristics include one of low heater resistance and a heater short. In another form, the controller 104 determines resistance of the heater 102 for scaling the input voltage based on the control algorithm.

Figure 2:
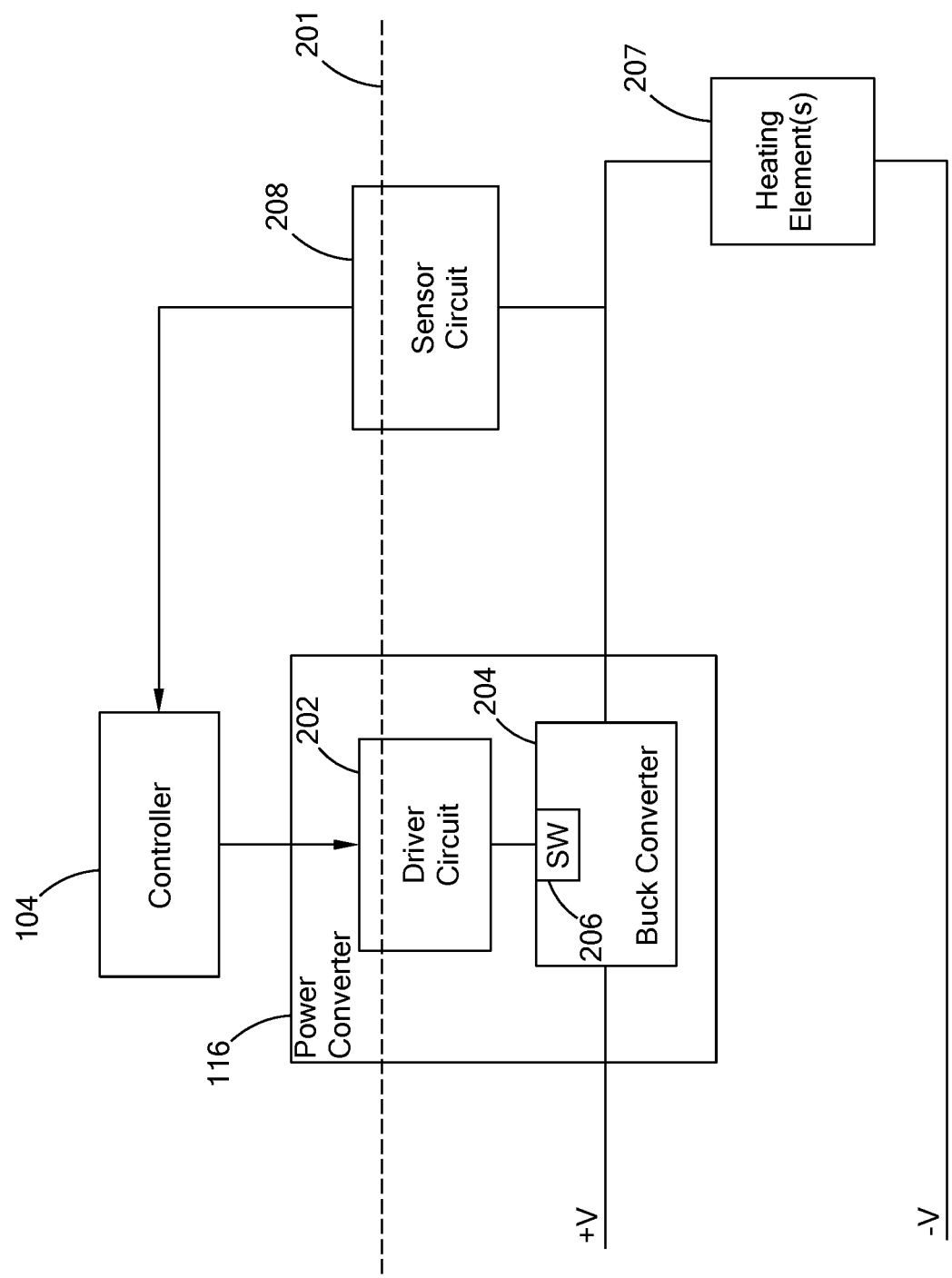
FIG. 2 is a block diagram of a power converter of the electrical thermal system of FIG. 1 in accordance with the teachings of the present disclosure.

Referring to FIG. 2, the system 100 includes electronic components, such as the controller 104 that operate at a lower voltage than, for example, the power converters 116. Accordingly, to protect the low voltage components from high voltage, the system 100 includes electronic components that isolate the low voltage components from the high voltage components and still allow the components to exchange signal. For purposes of illustration, a dashed line 201 represents the isolation of a low voltage section from a high voltage section of the system 100.

A given power converter 116 includes a driver circuit 202 and a buck converter 204 having a control switch 206 ("SW" in figure), which may also be referred to as a power switch. While specific components are illustrated, the power converter 116 may include other components, such as a rectifier and a bypass capacitor as described in association with FIG. 3.

The driver circuit 202 operates the control switch 206 based on an input signal from the controller 104. The driver circuit 202 includes electronics, such as an opto-isolator, or a transformer, among others, to communicate with the controller 104 and isolate the controller 104 from the power converter 116.

As described further herein, the buck converter 204, as a step-down voltage converter, is operable to decrease the voltage of the power source 108. For example, the AC voltage from the power source 108 (e.g., 208 VAC) is rectified to generate a rectified AC voltage that is applied to the buck converter 204. Based on the operation of the control switch 206, the buck converter 204 bucks, or in other words, decreases the voltage and increases the current from the power source 108 and applies the adjusted voltage and current to respective heating elements 207 of the heater 102. To reduce voltage ripple; filters made of capacitors or a combination of capacitor and inductors are added to the output and/or the input of the buck converter 204.

The system 100 further includes a sensor circuit 208 that transmits signals indicative of the performance of the heater 102 to the controller 104. The sensor circuit 208 may include requisite circuitry for measuring voltage and/or current to the heating element. The sensor circuit 208 may also include additional circuitry, such as isolated analog-to-digital converters, opto-isolators, or transformers, among others, for transmitting signals between the low and high voltage sections of the system. In one form of the present disclosure, the sensor circuit 208 includes a current sense resistor, a voltage sense resistor, and a transistor for shunting the current sense resistor to carry the load current when the control switch 206 is in predetermined state. The current sense resistor, the voltage sense resistor, and the transistor are coupled to the buck converter 204 of the power converter 116. The sensor circuit 208 measures at least one of current or voltage applied to the heating elements by the buck converter 204, and transmits the data as feedback to the controller 104, which in return determines the desired voltage output of the power converter 116.

Figure 3:
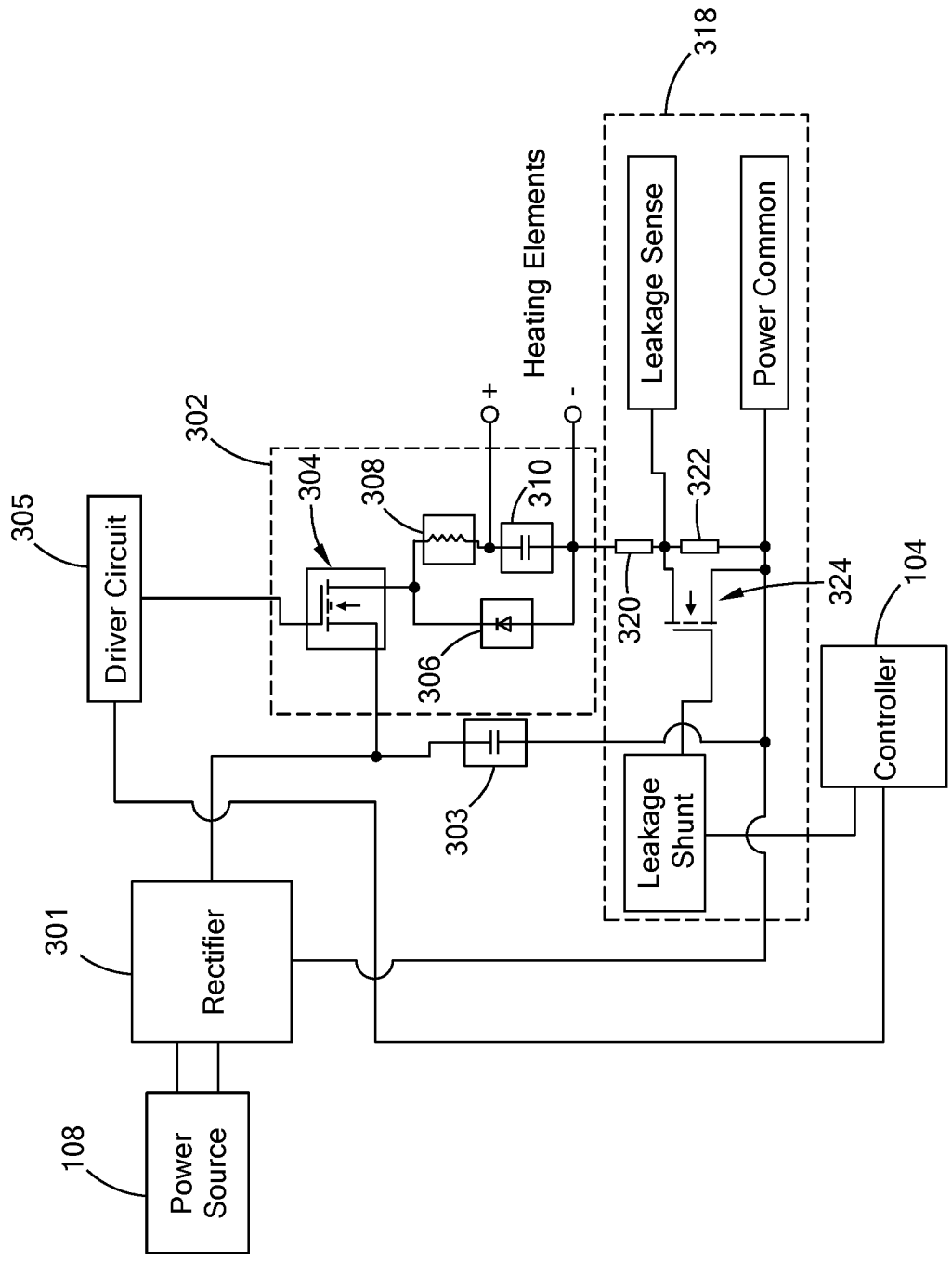
FIG. 3 is a schematic diagram of a power converter of FIG. 2 in accordance with the teachings of the present disclosure.

Referring to FIG. 3, an example schematic diagram of a power converter 300 is illustrated. The power converter 300 may be provided as the power converter 116 and includes a rectifier 301, a buck converter 302, and a bypass capacitor 303 (i.e., an input capacitor). The bypass capacitor is disposed between the rectifier 301 and the buck converter 302 and in parallel with the buck converter. Details regarding the bypass capacitor 303 is described below in association with the operation of the buck converter 302. In one form, the rectifier 301 is configured to rectify a line power having a line energy and the buck converter 302 generates a desired voltage output based on the rectified line power. The rectifier 301 may be a passive rectifier or an active rectifier operable by the controller 104.

The buck converter 302 includes a transistor 304 (e.g., field effect transistor), a diode 306, an inductor 308, and an output capacitor 310. The transistor 304 is operable by the controller 104 via a driver circuit 305 as a control switch to control the flow of current through the buck converter 302. Generally, a transistor includes a control terminal and based on a voltage applied to the control terminal, the transistor can operate as a closed switch to have electric current flow through a conducting channel between the source and drain regions of the transistor or as an open switch in which no current flows through the conducting channel. An N-type transistor performs as an open switch when no voltage is applied to the control terminal and as a closed switch when voltage (e.g., 5V) is applied. Alternatively, a P-type transistor performs as an open switch when voltage is applied to the control terminal, and as a closed switch when no voltage is applied to the control terminal. While the transistor 304 is illustrated as an N-type transistor, the transistor 304 may also be a P-type.

In operation, when the transistor 304 is in a closed state (i.e., closed switch), the buck converter 302 is electrically coupled to the rectifier 301 to apply the rectified line power such that current through the buck converter 302 begins to increase. An opposing voltage is generated across the inductor 308 terminals that counteracts the voltage from the rectifier 301, thereby reducing the net voltage across the terminals of the heating elements. Overtime, the rate of change of current begins to decrease, thus decreasing the voltage across the inductor 308 and increasing the voltage applied to the terminals of the heating elements. When the transistor 304 is in the open state (i.e., open switch), the buck converter 302 is electrically decoupled from the rectifier 301 and the inductor 308 begins to discharge causing a voltage drop across the inductor 308 and operating as a current source. Specifically, the magnetic field generated by the inductor 308 supports the current flowing through the terminals of the heating elements.

The pulse width of the drive signal applied to the transistor 304 controls the voltage output of the buck converter 302. Specifically, the amplitude of the voltage output depends on a conduction/switching rate (i.e., duty cycle) of the transistor 304. The smaller the conduction rate, the smaller the amplitude of the voltage output.

The ON-OFF switching of the transistor 304 creates a switching energy concurrently with the desired voltage output. The bypass capacitor 303 is configured to bypass the switching energy at the input to dissipate the switching energy during each cycle of the line power. That is, unlike a bulk capacitor such as DC-link capacitor commonly used in traditional power converters as an "input capacitor", the bypass capacitor 303 is not designed to store energy, but is configured to absorb the switching energy as the rectified line energy is being converted to the desired voltage output. Accordingly, in one form, the capacitance of the bypass capacitor 303 is substantially less than that of a DC-link capacitor. The output capacitor 310 is configured to further transfer the switching energy, but does so at the output FIG. 3 also illustrates an example of a sensor circuit 318 for measuring change in voltage at temperature sensing power pins (not shown). In one form, the sensor circuit 318 includes a current sense resistor 320, a leakage sense resistor 322 and a field effect transistor (FET) 324 for shunting the leakage sense resistor 322 for measuring voltage. The sensor circuit 318 is in communication with the controller 104 to provide data indicative of, for example, change in voltage at the temperature sensing power pins. Based on the voltage, the controller 104 determines a temperature associated with the resistive heating element coupled to the temperature sensing power pins.

Figure 4:
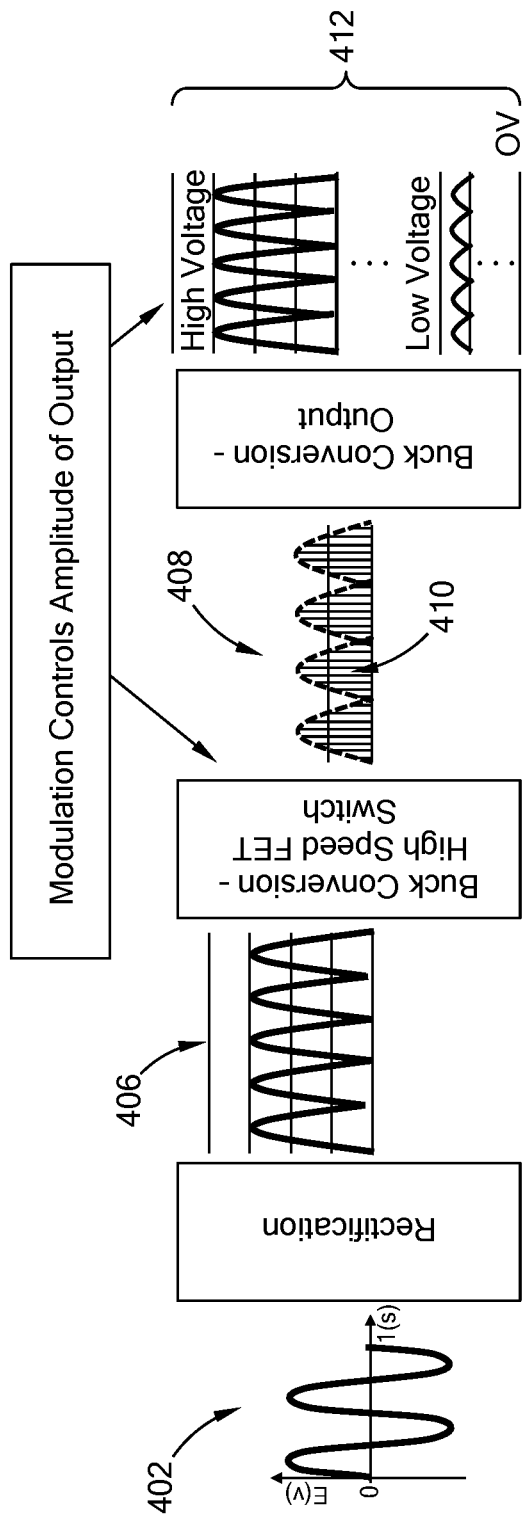
FIG. 4 is schematic diagram illustrating power conversion of an input voltage waveform in accordance with the teachings of the present disclosure.

Referring to FIG. 4, an example power conversion of a line power having a line energy (i.e., an input signal) by the power converter 300 of the present disclosure is provided. Here, a single-phase AC voltage 402 (i.e., line power) is rectified by the rectifier 301 (identified as "Rectification" in FIG. 4) to provide a rectified AC signal 406 (i.e., a rectified line power). The rectified AC signal 406 is bucked to generate a desired voltage output. In particular, the rectified AC signal 406 is selectively applied to the buck converter 302 by the transistor 304, which is being driven by the controller 104 via the driver circuit 305. The buck converter 302 outputs a voltage signal 408 defined by a plurality of pulses with a switching energy captured as voltage spikes 410 (i.e., "switching energy 410", herein). The switching or bucking of the rectified signal is generally provided as "Buck Conversion-High Speed FET Switch" in FIG. 4. The bypass capacitor 303 dissipates or bypasses the switching energy at the input to output a variable voltage output 412, as the desired voltage output, which is generally referenced as "Buck Conversion-Output" in FIG. 4. The variable voltage output 412 may be less than or equal to the line power (e.g., 0V-208V) and is applied to a load, such as the heater.

As illustrated in FIG. 4, the switching energy 410 is removed from the voltage output and the current drawn from the line power is in phase with the desired voltage output. The power converter 300 of the present disclosure reduces line power to any given power level, is operable to reduce harmonics, and thus, further reduce leakage current. Whereas, phase angle control can add high frequency harmonics to the heater, which can increase leakage current. In addition, the configuration of the power converter provides power factor correction. That is, the electric current is drawn from the line power in phase with the isolated voltage output, and thus, may not need additional circuitry for correcting the power factor, such as the bulk capacitors.

While the line power in FIG. 4 is illustrated as a single-phase AC signal, the line power may also be a direct current (DC) power signal. That is, the power converter of the present disclosure may receive an AC or a DC input signal and outputs a desired voltage output having less than or equal voltage in the same form, rectified AC or DC, respectively.

FIGS. 5A-5C illustrate drive waveforms for the transistor provided in the buck converter at different conduction rates (e.g. 5%, 25%, and 50%), and FIGS. 6A-6C illustrate expected voltage outputs of the buck converter based on the drive waveforms of FIGS. 5A-5C. When a modulated drive signal having a 50% conduction rate is applied to the transistor, the buck converter outputs a voltage that is greater than a voltage outputted with a drive signal having a 5% conduction rate. Accordingly, by controlling the pulse width of the drive signal, the controller 104 controls the voltage output of the power converter 116 and thus, independently controls the voltage applied to heating elements.

The controller 104 determines the desired voltage output of a given power converter 116 based on at least one of temperature, resistance, current and/or voltage at the heater 102, which are collectively referred to as input parameters. For example, the controller 104 is configured to operate the power converter 116 to adjust the input voltage based on the resistance of the heater 102 such that power from power converter 116 matches the change in the resistance of the heating elements of the heater 102. In another example, the controller 104 switches the control switch at a selected duty cycle to adjust the input voltage, where the duty cycle is directly proportional to a scaling factor. The controller 104 selects the duty cycle based on at least one of the load current and the detected voltage at the heater 102 or, more specifically, a temperature of the respective heating elements.

In one form of the present disclosure, the controller 104 uses a state mode control in which the controller 104 determines an operational state of the heater 102 based on one or more of the input parameters. The operational state of the heater 102 includes: idle mode in which no power is being supplied to the heater 102; start-up mode in which low power is being supplied to measure voltage and current; soft-start mode in which the power is increased at a low ramp rate until a specific resistance set point is passed; rate mode in which the temperature is increased at a ramp rate selected based on a material of the heater; hold mode in which temperature of the heater 102 is controlled to a specific set point using, for example, a continuous proportional-integral-derivative controller (PID control). These operation states are merely exemplary and could include other modes while remaining within the scope of the present disclosure.

Based on the operational mode of the heater 102, the controller 104 independently controls the heating elements by adjusting the input voltage applied to the heating elements from a respective power converter. The controller 104 can be configured in various ways to adjust the input voltage including but not limited to: (1) modifying PID parameters according to the operational state; (2) changing a mode that is automatic (no user input) to manual (user inputs received by controller) or changing a mode that is manual to automatic; (3) setting a manual percent power; (4) starting a set point ramp; (5) modifying an integral (holding term) of the PID control by offsetting the integral, scaling the integral, and/or making the modification based on temperature; and (6) changing voltage when a new operation state is entered. The logic used by the controller 104 for adjusting the voltage can be triggered in various suitable ways including but not limited to: (1) detecting start-up; (2) proximity of a process temperature to a set point; (3) deviation of the process temperature from the set point; (4) change in the set point; (5) exceeding the process temperature; (6) falling below the process temperature; (7) lapse of a predetermined time period; (8) a general system reading to be reached (e.g., current, voltage, wattage, resistance, and/or percent of power). The thermal system includes multiple states, where each state has unique settings to create a programmable state machine providing optimum performance in a dynamic system. Each state may define the next state that is entered when the condition is met.

The controller 104 is configured to operate the power converter system 106 to apply a continuously variable voltage to the heating elements of the heater 102. The variable voltage has different amplitudes of power. The heater 102 is less susceptible to thermal cracks by using variable voltage to control ramp rates, and thus the variable voltage is operable to reduce temperature differences between the different heating zones. Such benefits are further realized when the thermal system utilizes two-wire control.

In one form of the present disclosure, the controller 104 is configured to provide model-based control to match PID states to system states. A ramp-up rate and heater testing are based on the operational states of the heater. A typical control method for powering the heater 102 has potential issue of causing cracks in a ceramic substrate, particularly when the resistive heating element is made of a material having a relatively high thermal coefficient of resistance (TCR). During heater start-up, the resistive heating element has a relatively low resistance when cold, and the controller 104 of the present disclosure can manage low resistance cold start by limiting power and voltage, thereby inhibiting current-rush in. When a temperature of a respective heating zone is ramped up to a set point, a temperature difference between the respective zone and other zones is maintained within acceptable limits by adjusting ramp rates at the heater zones. Therefore, the power to the individual heating zones may be balanced. The ramp rate of the resistive heating elements may be controlled and adjusted by the controller in response to the operational states of the heating elements, thereby achieving a more uniform heating throughout the various heating zones.

FIGS. 7A, 7B, 7C, and 7D, illustrate example voltage output waveforms of a power converter that provides power to one or more heating elements of a heater during a start-up mode, a warm-up mode, a steady state mode, and at a disturbance, respectively. As shown, the voltage waveforms applied to the heating elements are different. The voltage varies depending on the resistance of the heating elements, the current flowing through the heating elements, and the temperature of the heating elements. During start-up and warm-up when the temperature is relatively low, the voltage has a relatively small amplitude and thus, the wattage is relatively low. During steady state and disturbance/surge when the temperature is relatively high, the amplitude of the voltage is increased resulting in higher wattage.

More particularly, with regard to start-up, the resistance of the heating elements is low (e.g. 3 ohms), and if the heating elements receive a full-line voltage (e.g., 208V), the instantaneous current flowing through the heating elements and the resulting power is significantly large (e.g., approx. 69 A and 14,352 W). With the power converter system 106, the controller 104 adjusts the input voltage to the heating elements to a much lower voltage, e.g., 3V, to control the current and power (e.g., 1 A and 3 W). The controller 104 may then gradually increase the voltage applied based on the resistance of the heating elements and feedback information.

Generally, different heating elements of a heater may not be heated at the same rate even though the same power supply is applied to the heating elements. This may be caused by various factors, such as positions of the heating elements relative to heat sinks and the manufacturing non-uniformity in the heating zones. When a significant temperature difference occurs between adjacent heating zones, a significant difference in thermal expansion in the adjacent heating zones may result in cracks in the ceramic substrate of the heating plate. The electronic thermal system of the present disclosure includes a power converter system that includes one or more power converters for providing varied power to the heating elements for a precise and safer control of the heating elements and thus, the heater. For example, lower power may be supplied to one or more heating elements to minimize peak current or may be provided at an early stage of the heating and during shutdown to prevent thermal cracks in the substrate of the heating plate. The controller controls the power converter system to output different voltages and thus, controls the temperature of the individual heating zones. Accordingly, the electrical thermal system of the present disclosure adjusts the temperature differences between different zones to provide uniform temperature throughout the heater.

Therefore, the controller controls variable power supply to the individual heating elements based on the temperature of the heating elements and/or the operational state of the heating elements. The variable power control method of the controller of the present disclosure may: 1) allow control of peak current and voltage; 2) size power drop for a maximum wattage delivered at highest set point, and not at startup in rush; 3) allow use of a signal phase to deliver desired power; 4) control startup at low voltage to allow for short circuit/shorted heater detection; 5) for two-wire controls, temperature measurements can be significantly more stable due to continuously stable sinusoidal conduction, thereby allowing more detailed diagnostics; and 6) set power factor at 1.0.

The controller can also measure/control heater characteristics, such as current, voltage, wattage, resistance, line frequency. The controller provides temperature control of individual heating zones and manages the temperature differences between different zones in order to provide uniform temperature throughout the heating plate to inhibit generation of thermal cracks.

With the power converter system, the controller is configured to control power supply from the power source to the heater. The power source may be an AC source with phase fire control or a DC source with a switching device, and the heating elements may be made of different materials with a wide range of resistances. For example, when molybdenum is used to form the heating element, the resistive heating element has very low resistance when cold and thus, draws relatively high currents. The power conversion technology of the present disclosure applies lower voltage to manage the current to an acceptable level during low resistance cold phase of warm up.

In addition, the controller also provides multiple supplementary and complementary sensing methods based on pedestal construction and application. For example, discrete temperature sensors such as thermocouples or RTDs (Resistance Temperature Detectors) may be used when placement/space allows. Optical florescent sensing may be used for a high plasma application, such as that disclosed in U.S. Pat. No. 9,625,923, which is commonly assigned with the present application and the contents of which are incorporated herein by reference in their entirety. Two-wire sensors, as set forth above, may also be employed. These temperature sensors may also be used for over temperature limiting, among other functions while remaining within the scope of the present disclosure.

In this application, the term "controller" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The term memory is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory.

Unless otherwise expressly indicated herein, all numerical values indicating mechanical/thermal properties, compositional percentages, dimensions and/or tolerances, or other characteristics are to be understood as modified by the word "about" or "approximately" in describing the scope of the present disclosure. This modification is desired for various reasons including industrial practice, manufacturing technology, and testing capability.

As used herein, the phrase at least one of A, B, and C should be construed to mean a logical (A OR B OR C), using a non-exclusive logical OR, and should not be construed to mean "at least one of A, at least one of B, and at least one of C."

In the figures, the direction of an arrow, as indicated by the arrowhead, generally demonstrates the flow of information (such as data or instructions) that is of interest to the illustration. For example, when element A and element B exchange a variety of information, but information transmitted from element A to element B is relevant to the illustration, the arrow may point from element A to element B. This unidirectional arrow does not imply that no other information is transmitted from element B to element A. Further, for information sent from element A to element B, element B may send requests for, or receipt acknowledgements of, the information to element A.

The description of the disclosure is merely exemplary in nature and, thus, variations that do not depart from the substance of the disclosure are intended to be within the scope of the disclosure. Such variations are not to be regarded as a departure from the spirit and scope of the disclosure.

What is claimed is:

1. A method of converting power to operate a load being supplied by line power having a line energy, the method comprising:
   rectifying the line power;
   bucking the rectified line power to generate a desired voltage output, wherein the bucking creates a switching energy;
   bypassing the switching energy, wherein current is drawn from the line power in phase with the desired voltage output; and
   measuring the desired voltage output using a sensor circuit configured to measure the desired voltage output, wherein the sensor circuit includes a current sense resistor, a leakage sense resistor and a field effect transistor configured to shunt the leakage sense resistor.

2. The method of claim 1, wherein the line power is direct current (DC) power.

3. The method of claim 1, wherein the line power is alternating current (AC) power.

4. The method of claim 1, wherein the line power is a single-phase AC power.

5. The method of claim 1, wherein the line energy is not stored prior to bucking the rectified line power.

6. The method of claim 1, wherein the desired voltage output is less than or equal to an input voltage of the line power.

7. The method of claim 1 further comprising determining the desired voltage output prior to bucking the rectified line power.

8. The method of claim 1 further comprising applying the desired voltage output to a heater.

9. The method of claim 1, wherein during the bypassing of the switching energy, the switching energy is absorbed as the rectified line energy is being converted to the desired voltage output.

10. A system comprising:
    a rectifier configured to receive a line power having a line energy and rectify the line power;
    a buck converter configured to generate a desired voltage output based on the rectified line power, wherein the buck converter creates a switching energy concurrently with the desired voltage output;
    a bypass capacitor disposed between the rectifier and the buck converter and configured to bypass the switching energy to dissipate the switching energy, wherein current is drawn from the line power in phase with the desired voltage output; and
    a sensor circuit configured to measure the desired voltage output, wherein the sensor circuit includes a current sense resistor, a leakage sense resistor and a field effect transistor configured to shunt the leakage sense resistor.

11. The system of claim 10 further comprising a controller electrically coupled to the buck converter to operate the buck converter and configured to determine the desired voltage output to be generated by the buck converter.

12. The system of claim 11, wherein the buck converter includes a power switch, and the controller is configured to operate the power switch to generate the desired voltage output.

13. The system of claim 10, wherein the rectifier is configured to receive direct current (DC) power as the line power.

14. The system of claim 10, wherein the rectifier is configured to receive alternating current (AC) power as the line power.

15. The system of claim 10, wherein the rectifier is configured to receive a single-phase AC power as the line power.

16. The system of claim 10, wherein the desired voltage output is less than or equal to an input voltage of the line power.

17. The system of claim 10, wherein the bypass capacitor is electrically coupled in parallel with the buck converter.

18. The system of claim 10 further comprising an output capacitor disposed at an output of the buck converter to absorb the switch energy.

19. A thermal system comprising:
    the system of claim 10; and
    a heater electrically coupled to the system to receive the desired voltage output.

20. The system of claim 10, wherein the bypass capacitor is configured to absorb the switching energy as the rectified line energy is being converted to the desired voltage output.

21. The system of claim 10, wherein the bypass capacitor is configured to absorb the switching energy, and wherein the switching energy is defined by a plurality of pulses.

22. The system of claim 10, wherein the bypass capacitor is configured to dissipate energy associated with a first peak voltage of the rectified line power.

23. The system of claim 10, wherein the bypass capacitor is configured to reduce harmonics caused by the switching energy.

24. A system comprising:
    a rectifier configured to receive a line power having a line energy and rectify the line power;
    a buck converter configured to generate a desired voltage output based on the rectified line power, wherein the buck converter creates a switching energy concurrently with the desired voltage output;

a bypass capacitor disposed between the rectifier and the buck converter and configured to bypass the switching energy to dissipate the switching energy, wherein current is drawn from the line power in phase with the desired voltage output; and a sensor circuit configured to measure the desired voltage output, wherein the sensor circuit includes a current sense resistor and a field effect transistor configured to shunt leakage currents.

* * * * *